United States Patent
Kranz et al.

(10) Patent No.: US 11,425,836 B2
(45) Date of Patent: Aug. 23, 2022

(54) CONTROL ELECTRONICS IN MODULAR DESIGN

(71) Applicant: ebm-papst Mulfingen GmbH & Co. KG, Mulfingen (DE)

(72) Inventors: Christian Kranz, Weikersheim (DE); Alex Schneider, Künzelsau (DE); Malte Pils, Ilshofen-Oberaspach (DE); Oliver Bollgönn, Bretzfeld (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 0 days.

(21) Appl. No.: 17/059,977

(22) PCT Filed: Jun. 4, 2019

(86) PCT No.: PCT/EP2019/064411
§ 371 (c)(1),
(2) Date: Nov. 30, 2020

(87) PCT Pub. No.: WO2020/020519
PCT Pub. Date: Jan. 30, 2020

(65) Prior Publication Data
US 2021/0219450 A1    Jul. 15, 2021

(30) Foreign Application Priority Data
Jul. 27, 2018 (DE) .......................... 102018118181.7

(51) Int. Cl.
H05K 1/02      (2006.01)
H05K 7/14      (2006.01)
H05K 7/02      (2006.01)

(52) U.S. Cl.
CPC ......... *H05K 7/1432* (2013.01); *H05K 1/0209* (2013.01); *H05K 1/0233* (2013.01); *H05K 7/026* (2013.01)

(58) Field of Classification Search
None
See application file for complete search history.

(56) References Cited

U.S. PATENT DOCUMENTS 5,208,732 A    5/1993   Baudouin et al.
5,619,111 A    4/1997   Katagiri et al.
(Continued)

FOREIGN PATENT DOCUMENTS

CN    207299645      5/2018
DE    10035970 A1    2/2002
DE    102012213710   6/2013

OTHER PUBLICATIONS

International Search Report and Written Opinion dated Jul. 23, 2019.

*Primary Examiner* — Courtney L Smith
(74) *Attorney, Agent, or Firm* — Dickinson Wright PLLC

(57) ABSTRACT

The disclosure relates to control electronics in a modular design, comprising an electronic base module and a plurality of functional modules, wherein: the base module provides at least one DC link voltage UZK at a voltage supply output for the voltage supply of the functional modules and the functional modules are electrically and mechanically connected to the base module and are supplied with the DC link voltage UZK by the base module; the base module and the functional modules each have a carrier having electronic components, the electronic components of the base module producing the DC link voltage UZK, at least one functional module being fastened to the carrier of the base module; and the electronic components of the base module and of the functional modules are arranged separate from one another by means of a thermal decoupling and/or an EMC shield.

20 Claims, 2 Drawing Sheets

(56) References Cited

U.S. PATENT DOCUMENTS

| | | | |
|---|---|---|---|
| 7,876,561 B2* | 1/2011 | Schnetzka | F25B 49/025 |
| | | | 361/699 |
| 8,379,390 B2* | 2/2013 | Inoue | H01L 24/32 |
| | | | 361/713 |
| 8,749,980 B2* | 6/2014 | Won | H05K 1/144 |
| | | | 361/710 |
| 8,953,353 B2 | 2/2015 | Sasayama | |
| 9,420,731 B2* | 8/2016 | Hosseini | H01L 21/4875 |
| 9,756,718 B2* | 9/2017 | Kataoka | H05K 3/284 |
| 10,199,804 B2* | 2/2019 | Ramm | H01L 25/115 |
| 2006/0043238 A1* | 3/2006 | Inam | B64G 1/66 |
| | | | 244/129.1 |
| 2014/0246768 A1 | 11/2014 | Soyano | |
| 2015/0289411 A1* | 10/2015 | Kamiya | H01L 25/18 |
| | | | 361/701 |
| 2017/0345778 A1* | 11/2017 | Gremillet | H01L 23/053 |

\* cited by examiner

CONTROL ELECTRONICS IN MODULAR DESIGN

RELATED APPLICATIONS

This application claims priority to and is a 35 U.S.C. § 371 national phase application of PCT/EP2019/064411, filed Jun. 4, 2019 and claims priority to German Patent Application No. 10 2018 118 181.7, filed Jul. 27, 2018, the entire contents of which are incorporated herein by reference in their entirety.

FIELD

The present disclosure relates to control electronics in modular design.

BACKGROUND

Various modular control electronics are already known in the prior art. Often a compact design is used which has to meet the different installation conditions and the narrow space conditions. For this reason, functionally related subassemblies of the overall electronics, e.g., switching power supply, fan commutation, control and regulation devices, are mounted on separate printed circuit boards and inserted into a base carrier of the control electronics which usually supports the power electronics for supplying energy to the subassemblies.

However, this has the disadvantage that no easily implemented measures to improve electromagnetic compatibility (EMC) can be applied to the subassemblies and the base carrier, or that these have no or only an insufficient effect. In addition, the printed circuit boards may require separate voltage supplies and the printed circuit boards inserted into the base carrier or the electronic components of the subassemblies, respectively, are more sensitive to vibration and shock. Existing components for improving EMC and for the voltage supply are often implemented on each of the subassemblies' printed circuit boards in the control electronics known of the prior art and are therefore redundant. Furthermore, in many cases a cooling connection of the electronic components of the subassemblies is only insufficient or only realizable with increased effort.

BRIEF SUMMARY

It is therefore an objective of the present disclosure to provide flexibly structured control electronics in which components for voltage production as well as components for improving EMC are not redundant and at the same time a simple and space-saving structure of the control electronics is possible.

This objective is solved by the combination of features according to claim 1.

The basic idea of the present disclosure is a modular design in which the electrical components the control electronics is made of are arranged in modules separate from one another according to thermal aspects and according to EMC aspects so that the division of the components into modules and the arrangement and structure of the modules lead to an improvement of the EMC, whereby the modules can likewise be cooled specifically according to the respective thermal requirements. In addition, the arrangement of the modules can be used to ensure that components are not or only slightly heated by the components of adjacent modules.

According to the disclosure, control electronics in modular design is therefore proposed. The control electronics comprises an electronic base module and a plurality of functional modules. The base module provides at least one DC link voltage UZK at a voltage supply output for supplying voltage to the functional modules. The functional modules are electrically and mechanically connected to the base module and supplied with the DC link voltage UZK from the base module so that the functional modules do not each require a separate voltage supply. The base module and the functional modules each have a carrier with electronic components. Preferably, the carrier comprises at least one printed circuit board, the electronic components being arranged on at least one side of the printed circuit board and being connected to each other, for example, by conductor tracks embedded in the printed circuit board. The electronic components of the base module produce the DC link voltage UZK for supplying voltage to the electronic components of the functional modules. At least one functional module is attached to the carrier of the base module, for example, also indirectly via a spacer. The electronic components of the base module and of the functional modules are arranged separated from each other by means of thermal decoupling and/or EMC shield.

An advantageous embodiment of the disclosure further provides that the carrier of at least one functional module and/or the carrier of the base module each have a component side on which the electronic components are arranged, and a shielding side on which an EMC shielding device extending over the carrier is arranged. The EMC shielding device for shielding electromagnetic interference radiation can be designed, for example, as a coating or film which preferably covers the shielding side of the carrier completely. EMC shielding devices are usually made of or comprise electrically conductive material.

In order to connect the functional modules to each other and/or to the base module, a further advantageous design variant of the disclosure provides that a through-connector extends from the carrier of the base module to the carrier of a functional module or between the carriers of two functional modules.

In an advantageous further development, in order to improve the shielding effect of the shielding layer, the through-connector electrically connects the EMC shielding device of the base module with the EMC shielding device of the functional module or the EMC shielding devices of the functional modules with each other.

In a further development of the control electronics, at least one of the EMC shielding devices is also connected to a predetermined potential to improve the shielding effect.

In an advantageous embodiment of the control electronics, the carriers of the functional modules and the carrier of the base module are arranged in a predetermined arrangement parallel to each other and each spaced apart from each other in preferably predetermined mounting planes in order to achieve a further improvement in the shielding effect or to shield certain areas of the functional modules and the base module specifically from electromagnetic interference radiation.

An advantageous further development provides that one of the respective EMC shielding devices is arranged between the electronic components of the base module and the electronic components of a functional module and/or between the electronic components of two functional modules. Between the component sides of second carriers, one shielding side is thus provided with the EMC shielding device, whereby the components of the two carriers are separated from each other by the EMC shielding device.

In an alternative advantageous further development, the carriers of the functional modules and the carrier of the base module define, in a predetermined arrangement, a receiving space between them which is bounded on each side by the carriers of the functional modules and the carrier of the base module. The electronic components of the base module and the electronic components of the functional modules are arranged in the receiving space. The receiving space is shielded from electromagnetic radiation by the carriers and forms an EMC protection space in which the components are arranged and protected from electromagnetic interference radiation.

An alternative advantageous further development of the control electronics also provides that the carrier of the base module and the carriers of the functional modules are fixed to the spacer and are held in their predetermined arrangement relative to one another by the spacer.

In an alternative further development of the disclosure, the base module is formed integrally with a functional module together on the carrier of the base module.

Another advantage of an alternative design is that at least two functional modules are formed integrally with each other on a common carrier.

In an advantageous embodiment of the disclosure, at least some of the functional modules additionally comprise as electronic components at least one commutation unit for commutation of the DC link voltage UZK and an EMC filter. The EMC filter is designed to filter the commutated voltage.

For grouping for the purpose of the resulting arrangement of the components, an advantageous further development of the control electronics provides that the electronic components are separated into groups according to their function. The groups are evaluated according to the amount or the dimensioning of their electronic power input or power output. The evaluation of the power input or power output determines an assignment of the components to the base module and to the functional modules as well as the relative position of the components and/or the relative position of the base module and the functional modules to each other.

In addition to an evaluation of power input or power output, the susceptibility to electromagnetic interference radiation and/or a level of electromagnetic interference radiation emitted by the components can also be evaluated which determines the assignment of the components to the base module and the functional modules as well as the arrangement of the functional modules relative to each other and to the base module.

In an advantageous further development of the control electronics, the evaluation of the power input or power output determines a distance between the functional modules and a distance of the respective functional module to the base module. Additionally or alternatively, the evaluation can determine an alignment and/or spacing of the functional modules to each other or to the base module.

Cooling elements are also preferably arranged on the carrier of the base module and/or on the carriers of the functional modules.

BRIEF DESCRIPTION OF THE DRAWINGS

Other advantageous further developments of the disclosure are indicated in the dependent claims or are further described below together with the description of the preferred embodiment of the disclosure using the figures. In the figures:

The figures are exemplary schematic. Similar reference numerals in the figures indicate similar functional and/or structural features.

DETAILED DESCRIPTION

Figure 1:
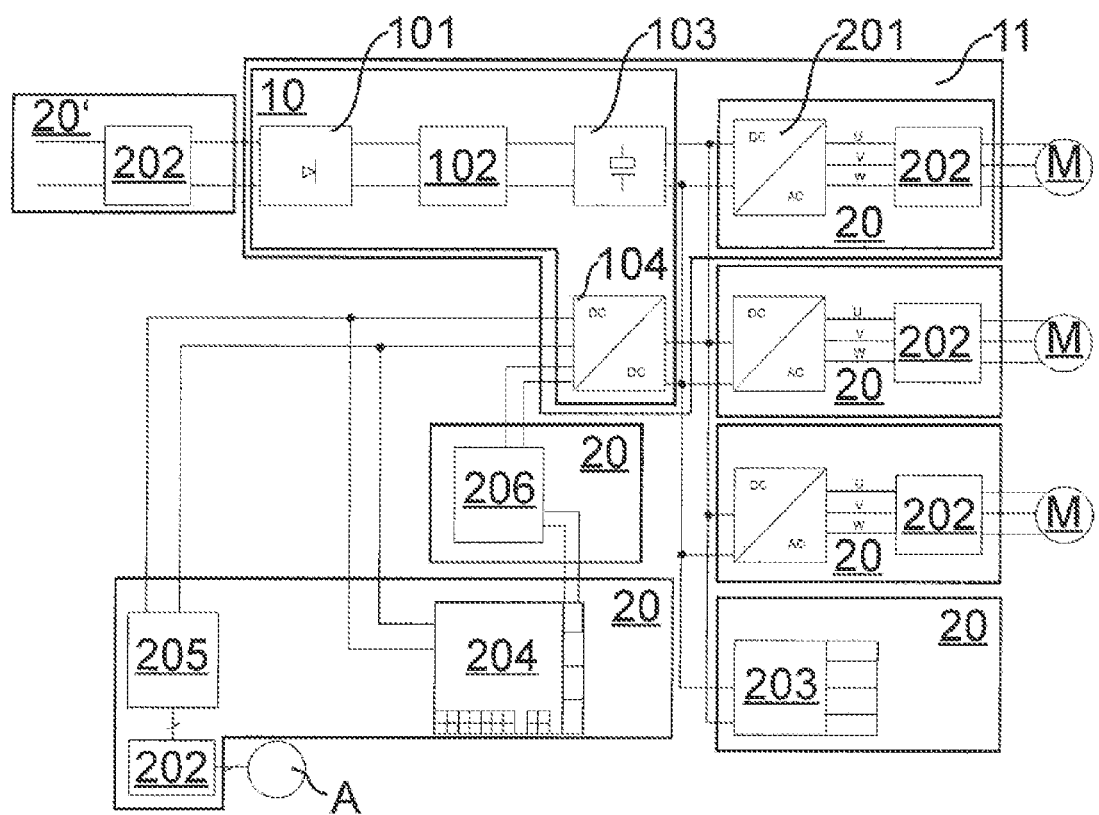
FIG. 1 shows a first control electronics consisting of several functional modules and a base module.

FIG. 1 schematically depicts the modular structure of control electronics. The components 11, 101, 102, 103, 104, 201, 202, 203, 204, 205, 206 were grouped into modules according to their function and their electromagnetic interference power. For this purpose, all components which are used to produce the DC link voltage UZK have been assigned to base module 10.

The components for producing the supply voltage from a DC link voltage UZK produced in the base module 10 and for regulating a load, for example a motor M, are grouped into functional modules 20, wherein the power input and thus the temperature development of the components of a functional module 20 each do not exceed a predetermined limit value. The components can also emit electromagnetic interference radiation, wherein the components of a functional module do not exceed a predetermined limit value of interference radiation. The functional modules 20 are arranged on the base module 10 in a certain orientation and arrangement to each other based on their power input and the electromagnetic interference radiation they produce, which is not shown in FIG. 1. The functional modules 20 can be fixed to the base module 10, for example, in an arrangement as shown in FIGS. 2 and 3.

In the embodiment shown in FIG. 1, the base module 10 comprises a rectifier 101, a voltage regulating component 102 for voltage adjustment with integrated EMC filtering and a DC link capacitor 103 for producing the DC link voltage UZK. For EMC filtering of the input voltage of the base module 10, a premodule 20' is connected upstream of the base module 10 and of all functional modules 20 which is connected on the input side to the mains voltage and on the output side to the base module 10 and filters the mains voltage through an EMC filter 202 and provides the filtered voltage to the base module 10. The motors M are supplied with a three-phase UVW voltage connection. The associated functional modules therefore have a DC/AC converter 201 with commutation and an EMC filter 202 for filtering the AC voltage produced. In the exemplary embodiment shown, the EMC filter 202 is arranged between the DC/AC converter 201 and the motor M so that the voltage converted by the DC/AC converter 201 is filtered. Alternatively, the EMC filter 202 can also be arranged upstream of the DC/AC converter 201 in terms of line technology so that the DC/AC converter 201 is arranged between the EMC filter 202 and the motor M, wherein the DC link voltage UZK is filtered and then fed into the DC/AC converter 201 for conversion. The power input of the voltage production for the motors M is so high that each of them must be provided as a separate functional module 20. In addition, a separate functional module 20 must be provided for each motor M since each of the motors M has its own electrical parameter variables, each motor M is operated according to its own (individual) speed characteristic and the setpoint specifications can be different for each motor M or for each load (fan) driven by the respective motor M. A further functional module 20 supplies additional components or elements such as general loads such as a relay 203 with the required DC link voltage UZK. Further functional modules 20 which require a low voltage instead of the DC link voltage UZK can share a low voltage converter 104 and be supplied with low voltage from it. The low-voltage converter 104 is part of the base module 10. The low voltage can be used to supply, for example, a functional module 20 with a display 206 or a functional module 20 for regulating a refrigeration circuit. In the present exemplary embodiment, the refrigeration circuit regulation comprises at least the components 202, 204, 205 which supply voltage to and control at least one expansion valve A for refrigeration circuit regulation. The functional module 20 for regulating the expansion valve has a voltage producer 205 and an associated EMC filter for supplying voltage to valve A of the expansion valve. Furthermore, the functional module 20 for regulating the expansion valve comprises a refrigeration circuit regulation 204 which is connected to sensors and other system components.

Figure 2:
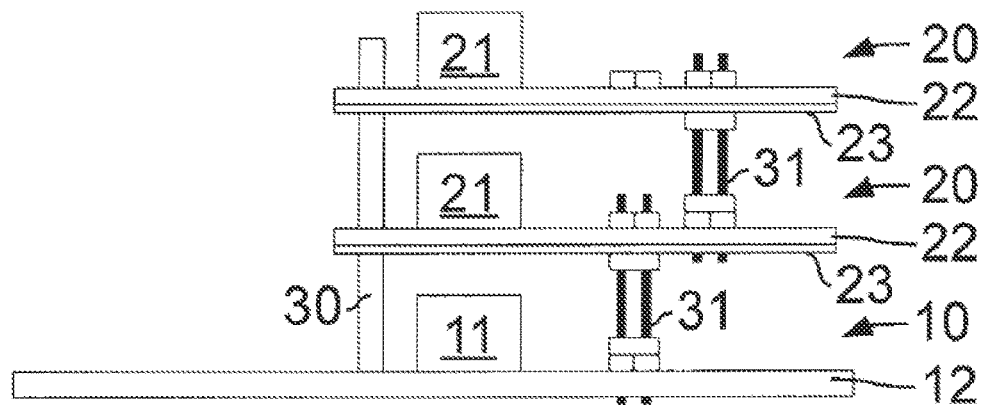
FIG. 2 shows an arrangement of a base module and of several functional modules of a second control electronics to each other.
Figure 3:
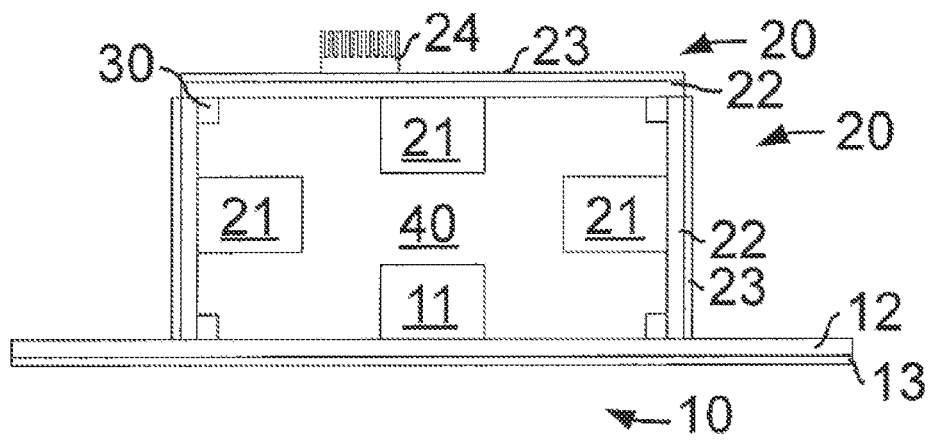
FIG. 3 shows an arrangement of a base module and of several functional modules of a third control electronics to each other.

FIGS. 2 and 3 each show an advantageous arrangement of the functional modules 20 to the base module 10.

In FIG. 2, the functional modules 20 with their respective carriers 22 are aligned parallel to the carrier 12 of the base module 10. The functional modules are held in their predetermined position to each other by the spacer 30. An EMC shielding device 23 is arranged between two carriers 12, 22 which in the example shown is designed as a layer completely covering the carrier 22 of the functional modules 20. The EMC shielding device 23 shields the components 11, 21 of the base module 10 and of the functional modules 20 from electromagnetic interference radiation produced by the components 11, 21 of the other module. In addition, the functional modules 20 are arranged according to the amount of their power input and the amount of interference radiation they produce. The functional module 20, the components 21 of which have the highest power input and thus the highest heat generation and emit the most interference radiation compared to the components 21 of the other functional modules 20, is the farthest away from the base module 10. In addition, the EMC shielding devices are connected to each other by means of through-connectors 31 which improves the shielding effect of the EMC shielding devices 23 connected to each other, wherein the through-connectors 31 may also be formed integrally with the spacer 30.

In the arrangement shown in FIG. 2, the components 11, 21 of the base module 10 and the functional modules 20 are protected against the interference radiation and the temperature of the other functional modules 20. Deviating from this, FIG. 3 shows a setup in which the components 11, 21 of the base module 10 and of the functional modules 20 are protected from externally acting interference radiation not produced by the components 11, 21 of the base module 10 or of the functional modules 20. The base module 10 and, for example, five functional modules 20 are arranged in a cuboid or cube shape so that the base module 10 and each of the functional modules determine one of the six sides of the cube or cuboid. The respective EMC shielding devices 13, 23 are directed outwards and the respective components 11, 21 are arranged in the interior of the cube or cuboid which forms a receiving space 40 for the components 11, 21. The components 11, 21 are surrounded and protected by the EMC shielding devices 13, 23 in each direction. In addition, a cooling element 24 is arranged on the outside or on one of the EMC shielding devices 13, 23 which can be in cooling contact with the receiving space 40 or one of the components 11, 21 or several of the components 11, 21. In this example, the spacer 30 can be designed as a frame on which the base module 10 and the functional modules 20 are fixed.

The arrangement shown in FIG. 2 can be combined with the arrangement in FIG. 3 so that, for example, in the receiving space 40 several functional modules 20 are arranged parallel to the base module 10.

The invention claimed is:

1. A control electronics in modular design, comprising an electronic base module, a plurality of functional modules, and through-connectors, wherein
   the base module provides at least one DC link voltage UZK at a voltage supply output for supplying voltage to the functional modules, and
   the functional modules are electrically and mechanically connected to the base module and supplied with the at least one DC link voltage UZK from the base module, wherein
   the base module and the functional modules each have a carrier with electronic components,
   the electronic components of the base module produce an intermediate circuit voltage UZK,
   at least one of the functional modules is attached to the carrier of the base module, and
   wherein the electronic components of the base module and of the functional modules are arranged separated from each other by way of at least one of thermal decoupling and EMC shielding devices,
   wherein one of the through-connectors extends from the carrier of the base module to the carrier of the functional module or between the carriers of two of the functional modules.

2. The control electronics according to claim 1, wherein the carrier of the at least one of the functional modules and/or the carrier of the base module each have a component side on which the electronic components are arranged, and a shielding side on which one of the EMC shielding devices extending over the carrier is arranged.

3. The control electronics according to claim 1, wherein the through-connector electrically connects the EMC shielding devices of the base module to the EMC shielding device of the functional module or the EMC shielding devices of the functional modules to each other.

4. The control electronics according to claim 1, wherein at least one of the EMC shielding devices is connected to a predetermined potential.

5. The control electronics according to claim 1, wherein the carriers of the functional modules and the carrier of the base module are arranged in a predetermined arrangement parallel to one another and each spaced apart from one another.

6. The control electronics according to claim 2, wherein between the electronic components of the base module and the electronic components of the at least one of the functional modules and/or between the electronic components of two of the functional modules, one of the EMC shielding devices is arranged.

7. The control electronics according to claim 1, wherein the carriers of the functional modules and the carrier of the base module define, in a predetermined arrangement, a receiving space between them which is bounded on each side by the carriers of the functional modules and the carrier of the base module, and the electronic components of the base module and the electronic components of the functional modules are arranged in the receiving space.

8. The control electronics according to claim 4, further comprising a spacer, wherein
the carrier of the base module and the carriers of the functional modules are fixed to the spacer and are held in their predetermined arrangement relative to one another by the spacer.

9. The control electronics according to claim 1, wherein the base module is formed integrally with the at least one of the functional modules together on the carrier of the base module.

10. The control electronics according to claim 1, wherein at least two of the functional modules are formed integrally with each other on a common carrier.

11. The control electronics according to claim 1, wherein at least some of the functional modules comprise as the electronic components a commutation unit for commutation of the DC link voltage UZK and an EMC filter which is designed to filter the commutated voltage.

12. The control electronics according to claim 1, wherein
the electronic components are separated into groups according to their function,
the groups are evaluated according to their electronic power input or power output, and
the evaluation of the power input or power output determines an allocation of the components to the base module and to the functional modules as well as their relative position to each other.

13. The control electronics according to claim 12, wherein
the evaluation of the power input or power output determines a distance between the functional modules and a distance of the respective functional module to the base module.

14. The control electronics according to claim 1, wherein
cooling elements are arranged on the carrier of the base module and/or on the carriers of the functional modules.

15. A control electronics in modular design, comprising an electronic base module and a plurality of functional modules, wherein
the base module provides at least one DC link voltage UZK at a voltage supply output for supplying voltage to the functional modules, and
the functional modules are electrically and mechanically connected to the base module and supplied with the at least one DC link voltage UZK from the base module, wherein
the base module and the functional modules each have a carrier with electronic components,
the electronic components of the base module produce an intermediate circuit voltage UZK,
at least one of the functional modules is attached to the carrier of the base module, and
wherein the electronic components of the base module and of the functional modules are arranged separated from each other by way of at least one of thermal decoupling and EMC shielding devices, and
wherein the carrier of the at least one of the functional modules and/or the carrier of the base module each have a component side on which the electronic components are arranged, and a shielding side on which one of the EMC shielding devices extending over the carrier is arranged.

16. The control electronics according to claim 15, further comprising through-connectors, wherein a through-connector extends from the carrier of the base module to the carrier of the functional module or between the carriers of two of the functional modules.

17. The control electronics according to claim 15, wherein between the electronic components of the base module and the electronic components of the at least one of the functional modules and/or between the electronic components of two of the functional modules, one of the EMC shielding devices is arranged.

18. A control electronics in modular design, comprising an electronic base module and a plurality of functional modules, wherein
the base module provides at least one DC link voltage UZK at a voltage supply output for supplying voltage to the functional modules, and
the functional modules are electrically and mechanically connected to the base module and supplied with the at least one DC link voltage UZK from the base module, wherein
the base module and the functional modules each have a carrier with electronic components,
the electronic components of the base module produce an intermediate circuit voltage UZK,
at least one of the functional modules is attached to the carrier of the base module, and
wherein the electronic components of the base module and of the functional modules are arranged separated from each other by way of at least one of thermal decoupling and EMC shielding devices, and
wherein at least one of the EMC shielding devices is connected to a predetermined potential.

19. The control electronics according to claim 18, further comprising through-connectors, wherein a through-connector extends from the carrier of the base module to the carrier of the functional module or between the carriers of two of the functional modules.

20. The control electronics according to claim 18, further comprising a spacer, wherein the carrier of the base module and the carriers of the functional modules are fixed to the spacer and are held in their predetermined arrangement relative to one another by the spacer.

* * * * *